United States Patent
Kim et al.

(10) Patent No.: US 7,719,893 B2
(45) Date of Patent: May 18, 2010

(54) NONVOLATILE MEMORY AND APPARATUS AND METHOD FOR DECIDING DATA VALIDITY FOR THE SAME

(75) Inventors: Jin-kyu Kim, Seoul (KR); Song-ho Yoon, Yongin-si (KR); Nam-yoon Woo, Suwon-si (KR)

(73) Assignee: Samsung Electronics, Ltd., Suwon-si (KR)

( * ) Notice: Subject to any disclaimer, the term of this patent is extended or adjusted under 35 U.S.C. 154(b) by 513 days.

(21) Appl. No.: 11/657,475

(22) Filed: Jan. 25, 2007

(65) Prior Publication Data

US 2007/0189107 A1 Aug. 16, 2007

(30) Foreign Application Priority Data

Feb. 16, 2006 (KR) .................. 10-2006-0015197

(51) Int. Cl.
*G11C 11/34* (2006.01)
(52) U.S. Cl. .................. 365/185.12; 365/185.11; 365/190; 365/238.5
(58) Field of Classification Search ............ 365/185.12, 365/238.5, 185.03, 185.11, 190
See application file for complete search history.

(56) References Cited

U.S. PATENT DOCUMENTS

2003/0112663 A1* 6/2003 Quader et al. .......... 365/185.22
2004/0145952 A1* 7/2004 Chen et al. ............. 365/185.33
2006/0221714 A1* 10/2006 Li et al. .................. 365/189.01

FOREIGN PATENT DOCUMENTS

| JP | 63-206834 A | 8/1988 |
| JP | 08-031196 A | 2/1996 |
| JP | 2003-15929 A | 1/2003 |
| KR | 10-2000-0068206 A | 11/2000 |
| KR | 10-2002-0010753 A | 2/2002 |
| KR | 10-2005-0070672 A | 7/2005 |

OTHER PUBLICATIONS

Bauer et al. "A Multilevel-Cell 32Mb Flash Memory," Originally published in ISSCC Digest of Technical Papers. 1995. 2 pages.*

* cited by examiner

*Primary Examiner*—Pho M Luu
*Assistant Examiner*—Tha-O Bui
(74) *Attorney, Agent, or Firm*—Sughrue Mion, PLLC

(57) ABSTRACT

Provided are a nonvolatile memory and an apparatus and method for deciding data validity for the same, in which validity of data stored in the nonvolatile memory can be decided. The nonvolatile memory includes a memory cell storing data bits in a plurality of pages included in a predetermined block through a plurality of states realized by at least two bits. The block includes a first page in which data bits for determining validity of data bits written by a user are stored, and a second page in which the data bits written by the user are stored.

12 Claims, 5 Drawing Sheets

NONVOLATILE MEMORY AND APPARATUS AND METHOD FOR DECIDING DATA VALIDITY FOR THE SAME

CROSS-REFERENCE TO RELATED APPLICATION

This application claims priority from Korean Patent Application No. 10-2006-0015197 filed on Feb. 16, 2006 in the Korean Intellectual Property Office, the disclosure of which is incorporated herein by reference in its entirety.

BACKGROUND OF THE INVENTION

1. Field of the Invention

Apparatuses and methods consistent with the present invention relate to a nonvolatile memory and an apparatus and method for deciding data validity for the same, and more particularly, to a nonvolatile memory and an apparatus and method for deciding data validity for the same, in which validity of data stored in the nonvolatile memory can be decided.

2. Description of the Related Art

Generally, embedded systems, such as electric home appliances, communication devices, and set top boxes, widely employ a nonvolatile memory as a storage medium that stores data.

A flash memory, which is mainly used as the nonvolatile memory, is a nonvolatile memory device that can electrically erase or rewrite data. Such a flash memory is suitable for a portable device due to its lower power consumption than a storage medium based on a magnetic disk memory, its fast access time equal to that of a hard disk, and its small size.

A basic mechanism for storing data bits in the aforementioned nonvolatile memory is a memory cell. The memory cell is composed of a single field effect transistor which includes a control gate, a floating gate, a source, and a drain. In this case, data bits are stored in the nonvolatile memory by changing a charge amount on the floating gate to change a threshold voltage of the memory cell. Also, the memory cell reads a voltage by selectively applying the voltage through a wordline of the control gate.

The memory cell provides storage ability capable of storing two states through one bit. In other words, the memory cell provides storage ability capable of storing either a bit of "1" or a bit of "0" in response to the applied voltage, wherein the bit of "1" corresponds to the state that the data are erased, and the bit of "0" corresponds to the state that the data are stored.

At this time, since essential requirements for a large sized memory device realize the low cost per bit, studies for storing data of a number of bits in one memory cell are actively in progress.

A technique that can remarkably reduce the cost per bit in a nonvolatile memory has been disclosed in "A Multilevel-Cell 32 Mb Flash Memory" in IEEE, ISSCC Digest of Technical Papers, pp. 132-133 by M. Bauer, et al. on February in 1995. This reference includes the technique for providing storage ability of four states through two bits per memory cell.

As described above, the nonvolatile memory having storage ability of four states through two bits per memory cell will be referred to as a multi level cell (MLC) nonvolatile memory. This MLC nonvolatile memory stores data bits corresponding to two pages through one memory cell. Also, the two pages corresponding to one memory cell will be referred to as least significant bit (LSB) page and most significant bit (MSB) page, respectively, and the data bits are stored from the LSB page.

In more detail, the MLC nonvolatile memory has four states S0, S1, S2, and S3 realized by two bits as shown in FIG. 1, wherein each state is composed of a pair of data bits of LSB page and MSB page. If a block of the nonvolatile memory is erased, every memory cell in the block has the state S0. At this time, if the data bits are written in the LSB page, the state is changed to the state S1. Again, if the data bits are written in the MSB page, the state is changed from S1 to S2. Meanwhile, the state is changed from S0 to S3 through the states S0, S1 and S2.

A time period T3 is required to change the state from S0 to S3 after a time period T1 and a time period T2 pass, wherein the time period T1 is required to change the state from S0 to S1 and the time period T2 is required to change the stage from S1 to S2. Accordingly, the time period T3 is longer than the time period T1.

Unexpected power failure frequently occurs in a system based on the nonvolatile memory in view of the application field of the system. Accordingly, steps to be taken against the power failure occurring in the middle of the operation of the nonvolatile memory will essentially be required.

FIG. 2 is a view illustrating the structure of a related art nonvolatile memory.

The general nonvolatile memory 10 is composed of a plurality of blocks 11 which include a plurality of pages 12. The respective blocks 11 have sizes of 16 KB, 64 KB, 128 KB, and 256 KB, wherein the sizes are decided by the number of pages included in the blocks and the size of each page. The blocks 11 are erasing units in the general nonvolatile memory 10, and the pages 12 are writing units therein.

If the power failure occurs in the middle of data writing in the general nonvolatile memory 10, the data to be written may not completely be written. Accordingly, when referring to the written data later, it is necessary to first decide whether the data are valid. To decide validity of the data, mirror data of the data whose validity is to be decided will be written together.

Specifically, as shown in FIG. 3, mirror data 22 and 23 of actual data 21 are written in a page 20 included in a predetermined block along with the actual data 21, so that the mirror data 22 and 23 are compared with the actual data 21 to decide validity of the data. If the mirror data 22 and 23 are equal to the actual data 21, it is decided that the actual data 21 are valid. Otherwise, it is decided that the actual data 21 are not valid.

However, if the mirror data 22 and 23 are written to decide validity of the data, the capacity required to store the data increases, whereby waste of a space in the nonvolatile memory becomes a problem.

Furthermore, when the two mirror data 22 and 23 are written to write the actual data 21 of 1011000011, the data may incompletely be written as 1011110011 in the case of unexpected power failure. In this case, since the mirror data 22 and 23 are also written as 1011110011, it is decided that the data are valid in spite of the fact that the data are not valid. For this reason, a problem occurs in that validity of the data is decided in error.

The Korean Patent Unexamined Publication No. 2002-0010753 discloses a method of verifying validity of a memory using only simple memory access, which includes announcing a function located in a specific code area as a safe guard to verify validity of a user buffer, calling a buffer address check function which verifies validity, and deciding validity of a page to which the user buffer belongs. However, this related art fails to disclose a method of deciding data validity in the case of an unexpected power failure.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a nonvolatile memory and an apparatus and method for deciding data validity for the same. Validity of data bits stored in the nonvolatile memory can be decided quickly and exactly while the waste of a space in the nonvolatile memory is avoided in the case of an unexpected power failure in the nonvolatile memory. Also, the nonvolatile memory has a memory cell that stores data bits of a plurality of pages through a plurality of states realized by at least two bits.

According to an aspect of the present invention, there is provided a nonvolatile memory including a memory cell storing data bits in a plurality of pages included in a predetermined block through a plurality of states realized by at least two bits, in which the block includes a first page where data bits for deciding validity of data bits written by a user are stored, and a second page where the data bits written by the user are stored.

According to another aspect of the present invention, there is provided an apparatus for deciding data validity of a nonvolatile memory. The apparatus includes a flash memory having a memory cell that stores data bits in first and second pages included in a predetermined block through a plurality of states realized by at least two bits, and a controller storing data bits for deciding validity of data bits written by a user in the first page and storing the data bits written by the user in the second page.

According to still another aspect of the present invention, there is provided a method of deciding data validity of a nonvolatile memory. The method includes storing data bits for deciding validity of data bits written by a user in a first page of a flash memory having a memory cell that stores data bits in the first page and a second page included in a predetermined block through a plurality of states realized by at least two bits, and storing the data bits written by the user in the second page.

BRIEF DESCRIPTION OF THE DRAWINGS

The above and other aspects of the present invention will be more apparent from the following detailed description of exemplary embodiments taken in conjunction with the accompanying drawings, in which.

DETAILED DESCRIPTION OF EXEMPLARY EMBODIMENTS OF THE INVENTION

Figure 1:
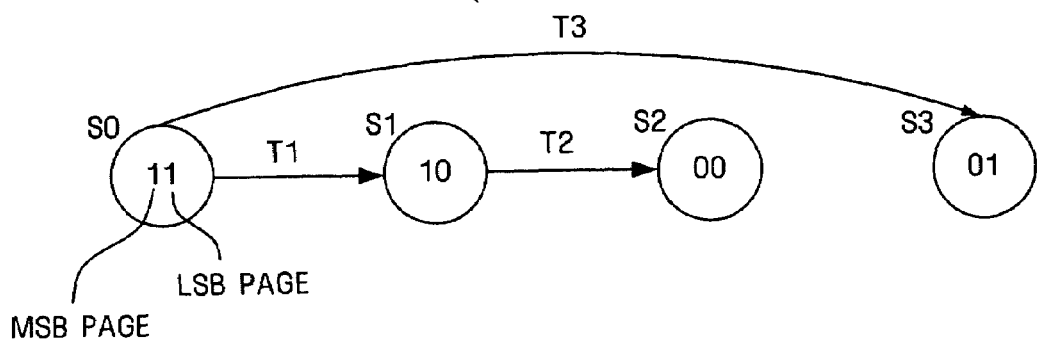
FIG. 1 is a view illustrating the state that a related art MLC nonvolatile memory is realized by a memory cell.
Figure 2:
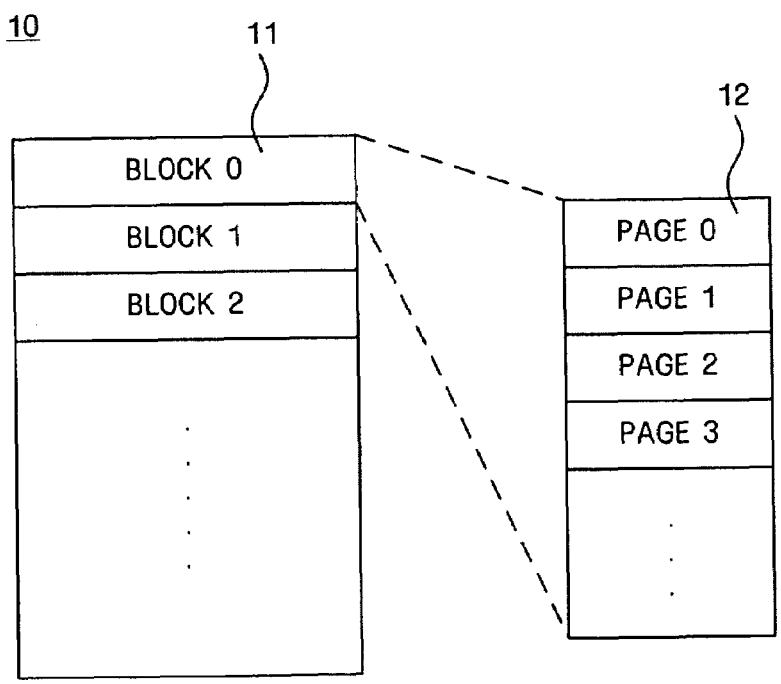
FIG. 2 is a view illustrating the structure of a related art nonvolatile memory.
Figure 3:
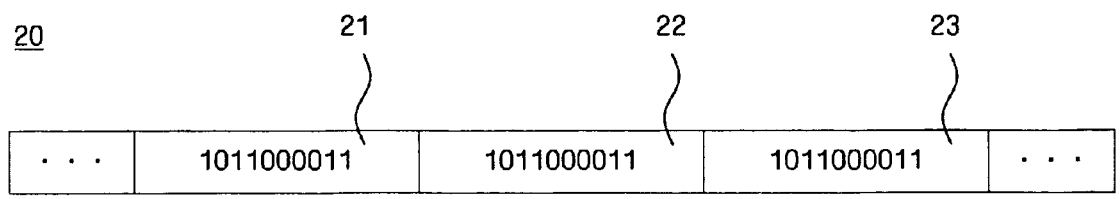
FIG. 3 is a view illustrating mirror data stored in a page according to the related art.

Hereinafter, exemplary embodiments of the present invention will be described in detail with reference to the accompanying drawings. The aspects and features of the present invention and methods for achieving the aspects and features will be apparent by referring to the exemplary embodiments to be described in detail with reference to the accompanying drawings. However, the present invention is not limited to the exemplary embodiments disclosed hereinafter, but can be realized in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the exemplary embodiments of the present invention, the same drawing reference numerals are used for the same elements across various figures.

The present invention will be described herein with reference to the accompanying drawings illustrating block diagrams and flowcharts for explaining exemplary embodiments of the present invention. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Also, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Figure 4:
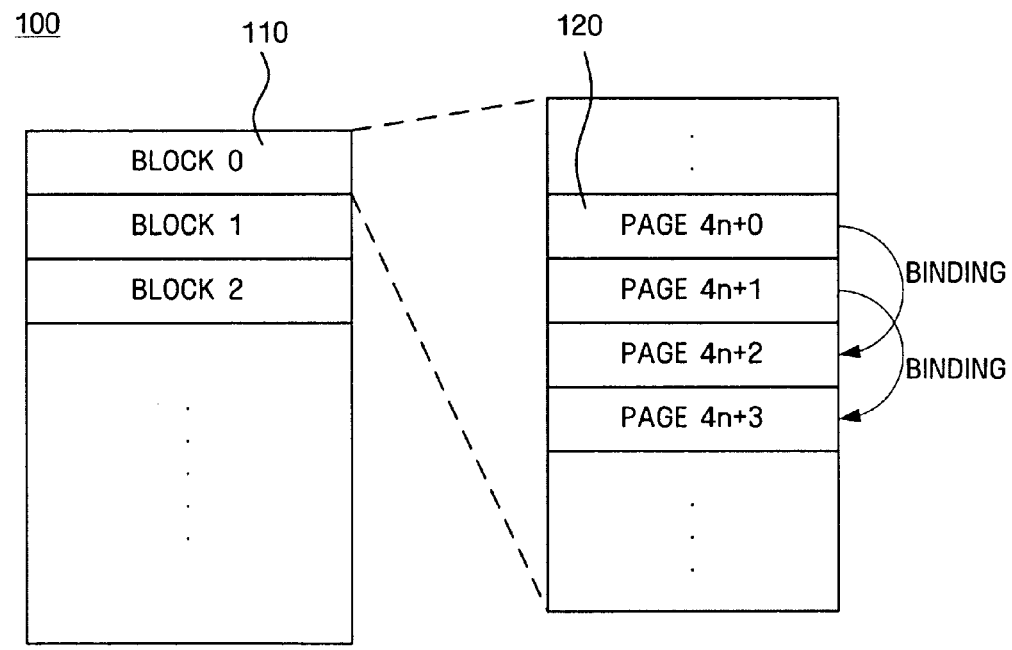
FIG. 4 is a view illustrating the structure of a nonvolatile memory according to an exemplary embodiment of the present invention.

FIG. 4 is a structure of a nonvolatile memory according to an exemplary embodiment of the present invention.

As shown in FIG. 4, the nonvolatile memory 100 according to an exemplary embodiment of the present invention is composed of a plurality of blocks 110 which includes a plurality of pages 120. It is to be understood that a page is a reading/writing unit of data and a block is an erasing unit of data. Also, an MLC nonvolatile memory, which includes a memory cell that stores data in a plurality of pages through a plurality of states realized by at least two bits, will be exemplarily used as the nonvolatile memory 100 according to the exemplary embodiment of the present invention.

Meanwhile, if a memory cell of the MLC nonvolatile memory stores data in a plurality of pages through two bits, the pages in which the data bits are stored by the same memory cell are bound to one another, and the memory cell can store the data in LSB and MSB pages among the pages included in a predetermined block, wherein the LSB and MSB pages are bound to each other. At this time, the LSB page and the MSB page may successively be located. Also, although the memory cell exemplarily stores the data bits through four states realized by two bits in the exemplary embodiment of the present invention, this example is nothing but to assist understanding of the present invention. The memory cell may store the data bits in a plurality of pages through a plurality of states realized by more than two bits.

For example, if a page $4n+0$ is bound to a page $4n+2$ and a page $4n+1$ is bound to a page $4n+3$, as shown in FIG. 4, the pages $4n+0$ and $4n+1$ may be the LSB page while the pages $4n+2$ and $4n+3$ may be the MSB page. Also, in the exemplary embodiment of the present invention, the LSB page will be referred to as a first page and the MSB page will be referred to as a second page. In the MLC nonvolatile memory according to the exemplary embodiment of the present invention, one memory cell exemplarily stores data bits for the first and second pages through two bits.

Figure 5:
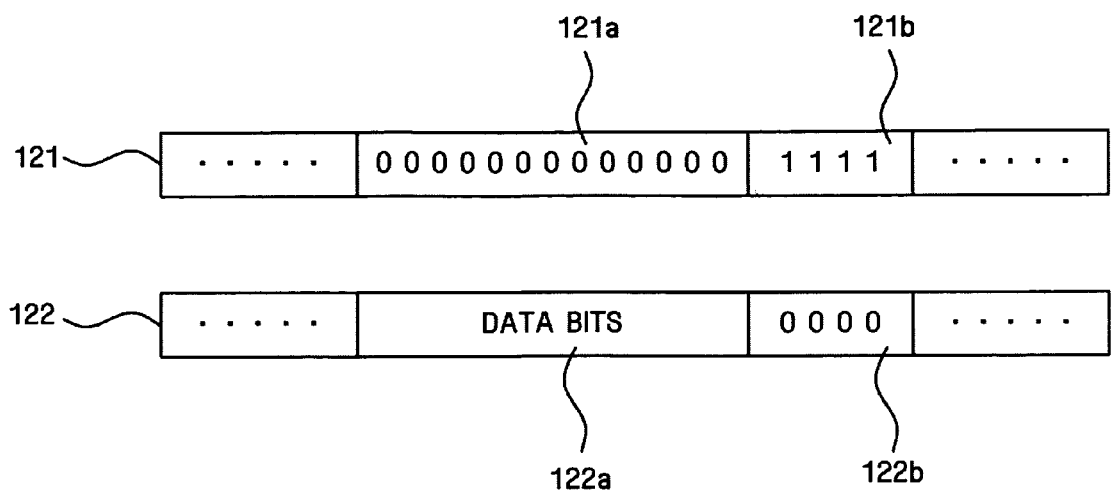
FIG. 5 is a view illustrating first and second pages according to an exemplary embodiment of the present invention.

FIG. 5 is a view illustrating the first and second pages according to an exemplary embodiment of the present invention.

As shown in FIG. 5, the first page 121 according to an exemplary embodiment of the present invention may include a first data area 121a and a first meta area 121b, and the second page 122 may include a second data area 122a and a second meta area 122b. Also, in the exemplary embodiment of the present invention, data bits for deciding validity of data written by a user can be stored in the first page 121, and data bits written by the user can be stored in the second page 122.

A bit of "0" is stored in the first data area 121a of the first page 121 while a bit of "1" is stored in the first meta area 121b. The data bits written by the user are stored in the second data area 122a of the second page 122 while a bit of "0" is stored in the second meta area 122b.

In the case of the MLC nonvolatile memory, the state realized by the memory cell is composed of a pair of data bits of the LSB and MSB pages, which are stored in the first and second pages 121 and 122, wherein the data bits become 11 in a state that the block is erased. At this time, in the case of the MLC nonvolatile memory, since the data bits are first stored in the first page 121, a pair of data bits will become 01. Afterwards, if the data bits are stored in the second page 122, a pair of data bits will become 00. If a pair of data bits is equal to 10, they will be obtained after passing through 11→01→00. Hereinafter, in the exemplary embodiment of the present invention, a pair of data bits corresponding to 11 will be referred to as a first state, a pair of data bits corresponding to 01 will be referred to as a second state, a pair of data bits corresponding to 00 will be referred to as a third state, and a pair of data bits corresponding to 10 will be referred to as a fourth state. The time required to change the state from the first state to the fourth state is longer than the time required to change the state from the first state to the second state or the time required to change the state from the second state to the third state.

Accordingly, if the bit of "0" is stored in the first data area 121a, the state of the memory cell is changed from the first state to the second state. If the bit of "1" is stored in the first meta area 121b, the state of the memory cell is maintained at the first state. At this time, the data bit written in the second data area 122a by the user is equal to "1" or "0". If the data bit of "1" is written in the second data area 122a, the second state is maintained, while if the data bit of "0" is written in the second data area 122a, the second state is changed to the third state. Also, if the bit of "0" is stored in the second meta area 122b, the state of the memory cell is changed from the first state to the fourth state.

Consequently, if the bits of "0" are all stored in the second meta area 122b, it is regarded that the data bits are completely stored in the second data area 122a. This is because the time required to change the state from the first state to the fourth state is longer than the time required to change the state from the second state to the third state as described above.

Figure 6:
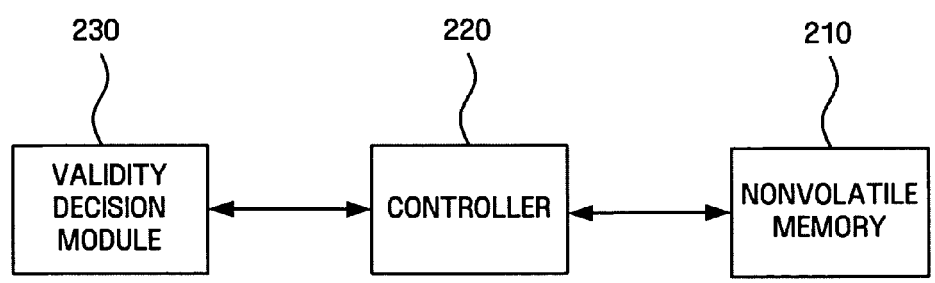
FIG. 6 is a view illustrating the construction of an apparatus for deciding data validity of a nonvolatile memory according to an exemplary embodiment of the present invention.

FIG. 6 is a block diagram illustrating the construction of an apparatus for deciding data validity of a nonvolatile memory according to an exemplary embodiment of the present invention.

As shown in FIG. 6, the apparatus 200 for deciding data validity of a nonvolatile memory according to an exemplary embodiment of the present invention includes a nonvolatile memory 210, a controller 220, and a validity decision module 230.

The nonvolatile memory 210 may be understood as the aforementioned nonvolatile memory 100 of FIG. 4. Accordingly, it is to be understood that the nonvolatile memory 210 of FIG. 6 has the same structure as that of the nonvolatile memory 100 of FIG. 4 and its elements are the same as those of the nonvolatile memory 100 of FIG. 4.

The nonvolatile memory 210 is an MLC nonvolatile memory which includes a memory cell that stores data bits in a plurality of pages included in a predetermined block through a plurality of states realized by at least two bits, wherein the predetermined block includes a first page in which data bits for deciding validity of the data are stored, and a second page in which data written by the user are stored.

Furthermore, the first page may include a first data area and a first meta area, wherein the bit of "0" is stored in the first data area and the bit of "1" is stored in the first meta area. The second page may include a second data area and a second meta area, wherein the data bits written by the user are stored in the second data area and the bit of "0" is written in the second meta area.

The controller 220 controls voltage size of the memory cell of the nonvolatile memory 210 to change the state of the memory cell, thereby storing the data bits in the first and second pages. In the exemplary embodiment of the present invention, the controller 220 can store the bit of "0" in the first data area, the bit of "1" in the first meta area, the data bits to be written by the user in the second data area, and the bit of "0" in the second meta area.

In the case of the MLC nonvolatile memory, since the data bits are first stored in the first page, a pair of data bits will become 01. Afterwards, if the data bits are stored in the second page, a pair of data bits will become 00. If a pair of data bits is equal to 10, they will be obtained after passing through 11→01→100.

Accordingly, if the bit of 0 is stored in the first data area, the state of the memory cell is changed from the first state to the second state. If the bit of "1" is stored in the first meta area, the state of the memory cell is maintained at the first state. At this time, the data bit written in the second data area by the user is equal to "1" or "0". If the data bit of "1" is written in the second data area, the second state is maintained, while if the data bit of "0" is written in the second data area, the second state is changed to the third state. Also, if the bit of "0" is stored in the second meta area, the state of the memory cell is changed from the first state to the fourth state.

Consequently, if the bits of "0" are all stored in the second meta area, it is regarded that the data bits are completely stored in the second data area. This is because that the time required to change the state from the first state to the fourth state is longer than the time required to change the state from the second state to the third state as described above.

In the case of unexpected power failure occurring when the controller 220 is writing the data bits, if the bits of "1" and "0" are respectively stored in the first meta area and the second meta area, the data bit stored in the second data area may be decided as being valid. However, if not so, the data bit may not be decided as being valid.

The validity decision module 230 can decide validity of the data when referring to the data written in the nonvolatile memory 210. At this time, the validity decision module 230 can decide validity by referring to the data bits of the first and second pages included in a predetermined block of the nonvolatile memory 210. In more detail, if the bits of "1" are all stored in the first meta area of the first page and the bits of "0" are all stored in the second meta area of the second page, the data bits of the second data area, which correspond to those written by the user, can be decided as being valid.

As described above, if the bit of "0" is stored in the first data area, the state of the memory cell is changed from the first state to the second state. If the bit of "1" is stored in the first meta area, the state of the memory cell is maintained at the first state. At this time, the data bit written in the second data area by the user is equal to "1" or "0". If the data bit of "1" is written in the second data area, the second state is maintained, while if the data bit of "0" is written in the second data area, the second state is changed to the third state. Also, if the bit of "0" is stored in the second meta area, the state of the memory cell is changed from the first state to the fourth state. Accordingly, since the time required to change the state from the first state to the fourth state is longer than the time required to change the state from the second state to the third state, the data bit of the second data area can be decided as being valid.

Figure 7:
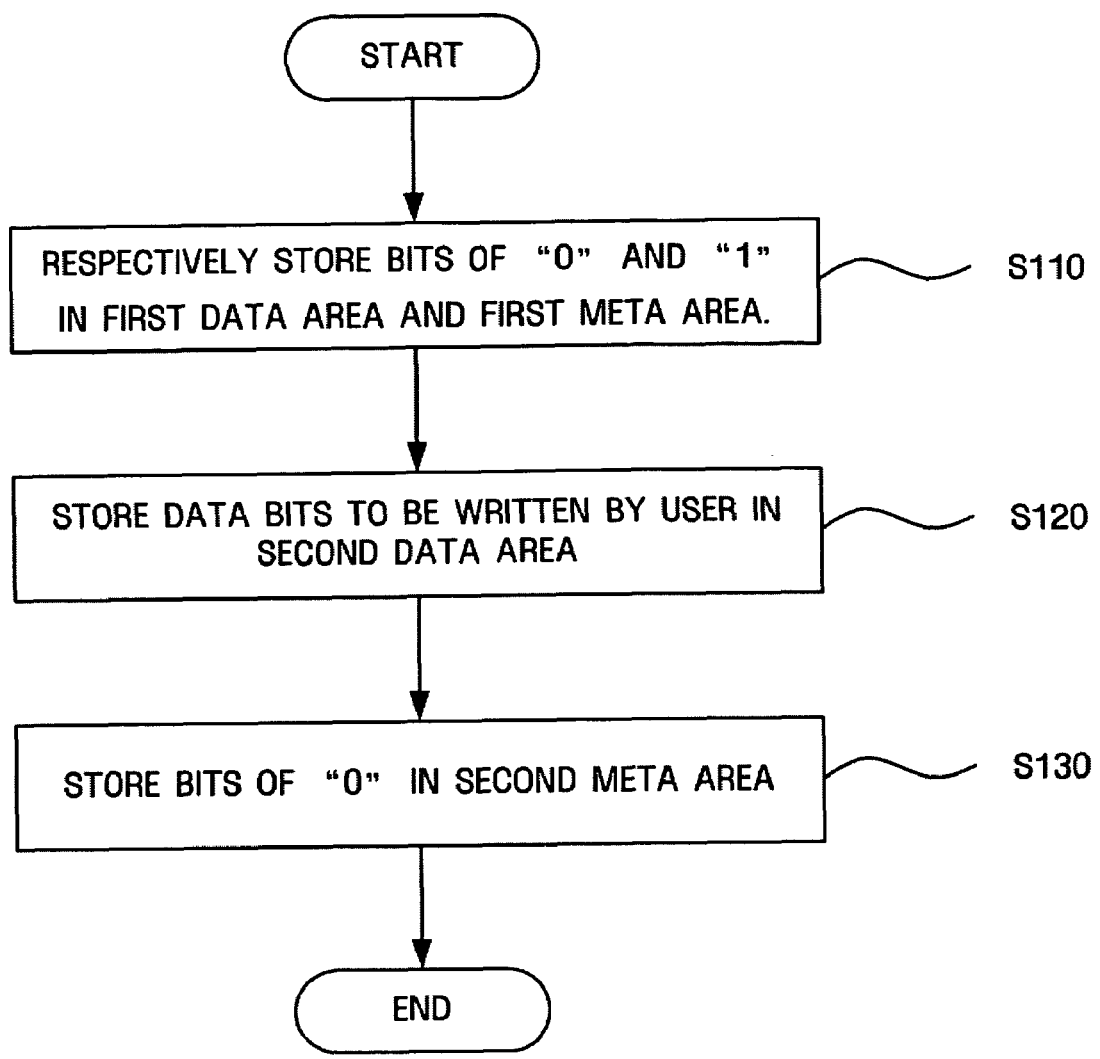
FIG. 7 is a flowchart illustrating a method of storing data bits in a nonvolatile memory according to an exemplary embodiment of the present invention.

FIG. 7 is a flowchart illustrating a method of storing data bits in a nonvolatile memory according to an exemplary embodiment of the present invention.

As shown in FIG. 7, first, the bit of "0" and the bit of "1" are respectively stored in the first data area and the first meta area of the first page when the user writes the data in the nonvolatile memory (S110). At this time, the sizes of the first data area and the first meta area can be decided depending on the data to be written by the user.

Afterwards, if the data bits are stored in the first data area and the first meta area of the first page, the actual data bits to be written by the user are stored in the second data area of the second page (S120). At this time, the data bits stored in the second data area are equal to those stored in the first data area in the position and the number of themselves.

If the data bits to be written by the user are stored in the second data area of the second page, the data bits of "0" are stored in the second meta area of the second page (S130). At this time, the position and the number of the bits of "0" stored in the second meta area are equal to those of the data bits stored in the first meta area of the first page.

As described above, if the bits of "1" are stored in the first meta area and the bits of "0" are stored in the second meta area, the state of the memory cell in the MLC nonvolatile memory is maintained in such a manner that a pair of the data bits stored in the first and second pages are changed in the order of 11→01→00→10. Accordingly, since the bits of "0" are all stored in the first data area, if the data to be actually written by the user are stored in the second data area, the states of 01 and 00 are maintained. In this case, the existing state remains unchanged or change in the state occurs once. Meanwhile, since change in the state occurs four times in the order of 11→01→00→10 to store the bits of "0" in the second meta area, the data bits stored in the second data area can be decided as being valid by referring to the data stored in the MLC nonvolatile memory if the bits of "1" and "0" are all stored in the first and second meta areas, respectively.

Figure 8:
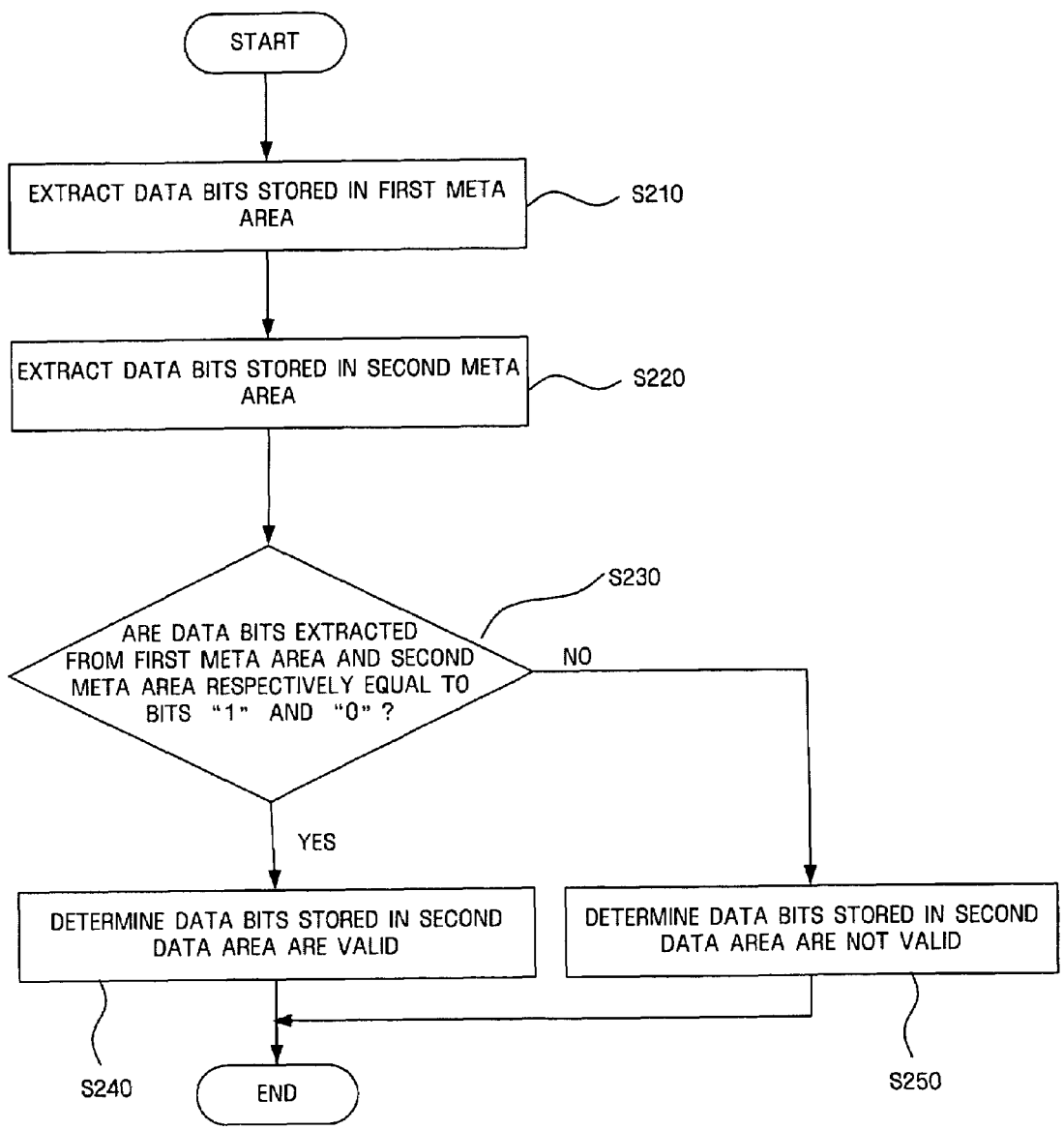
FIG. 8 is a flowchart illustrating a method of deciding data validity of a nonvolatile memory according to an exemplary embodiment of the present invention.

FIG. 8 is a view illustrating a method of deciding data validity of a nonvolatile memory according to an exemplary embodiment of the present invention.

As shown in FIG. 8, the data bits stored in the first meta area of the first page are extracted (S210). In this exemplary embodiment of the present invention, the case where the bits of "1" are all stored in the first meta area will exemplarily be described.

Afterwards, the data bits stored in the second meta area of the second page are extracted (S220). In the exemplary embodiment of the present invention, the case where the bits of "0" are all stored in the second metal area will exemplarily be described.

If the data bits stored in the first and second meta areas are respectively extracted, it is determined whether the data bits extracted from the first meta area and the data bits extracted from the second meta area are bits of "1" and "0", respectively (S230).

If it is determined that the data bits extracted from the first meta area and the data bits extracted from the second meta area are bits of "1" and "0", respectively, it is determined that the data bits stored in the second data area of the second page are valid (S240). Otherwise, it is determined that the data bits stored in the second data area are not valid (S250).

Since the bits of "0" are all stored in the first data area, if the data to be actually written by the user are stored in the second data area, the states of 01 and 00 are maintained. In this case, the existing state remains unchanged or change in the state occurs once. Since change in the state occurs four times in the order of 11→10→00→10 to store the bits of 0 in the second meta area, the data bits stored in the second data area can be decided as being valid by referring to the data stored in the MLC nonvolatile memory if the bits of "1" and "0" are all stored in the first and second meta areas, respectively.

In the exemplary embodiments of the present invention, the term "module", as used herein, means, but is not limited to, a software or hardware component, such as a Field Programmable Gate Array (FPGA) or Application Specific Integrated Circuit (ASIC), which performs certain tasks. A module may be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units.

As described above, according to the nonvolatile memory and the apparatus and method of deciding data validity for the same, validity of the data bits stored in the nonvolatile memory can easily be decided in the case of unexpected power failure occurring when the data bits are writing in the nonvolatile memory.

In addition, since no mirror data for deciding data validity are written, efficiency in use of a space for the nonvolatile memory can be improved.

Moreover, no overhead consumed to identify whether mirror data for deciding data validity are equal to the data written by the user is required.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A nonvolatile memory comprising:
a memory cell which stores data bits in a plurality of pages included in a block through a plurality of states realized by at least two bits,
wherein the block comprises:
a first page in which data bits for determining validity of data bits written by a user are stored; and
a second page in which the data bits written by the user are stored,
wherein the first page comprises a first data area in which bits of "0" are stored and a first meta area in which bits of "1" are stored, and the second page comprises a second data area in which the data bits written by the user are stored, and a second meta area in which bits of "0" are stored.

2. The nonvolatile memory of claim 1, wherein the states comprise a pair of data bits stored in the first and second pages, respectively, in response to a voltage applied to the memory cell, the pair of data bits being sequentially changed in the order of 11, 01, 00 and 10 depending on a size of the applied voltage.

3. An apparatus for deciding data validity of a nonvolatile memory, the apparatus comprising:
a flash memory comprising a memory cell that stores data bits in first and second pages included in a block though a plurality of states realized by at least two bits; and
a controller which stores data bits for determining validity of data bits written by a user in the first page, and stores the data bits written by the user in the second page,
wherein the first page comprises a first data area in which bits of "0" are stored and a first meta area in which bits of "1" are stored, and the second page comprises a second data area in which the data bits written by the user are stored, and a second meta area in which bits of "0" are stored.

4. The apparatus of claim 3, wherein the states comprise a pair of data bits stored in the first and second pages, respectively, in response to a voltage applied to the memory cell, the pair of data bits being sequentially changed in the order of 11, 01, 00 and 10 depending on a size of the applied voltage.

5. The apparatus of claim 3, further comprising a validity decision module which determines validity of the data bits stored in the second page.

6. The apparatus of claim 5, wherein the validity decision module decides that the data bits of the second data area are valid if bits of "1" are all stored in the first meta area and bits of "0" are all stored in the second meta area.

7. A method of deciding data validity of a nonvolatile memory, the method comprising:
(a) storing data bits for determining validity of data bits written by a user in a first page of a flash memory including a memory cell that stores data bits in the first page and a second page included in a block through a plurality of states realized by at least two bits; and
(b) storing the data bits written by the user in the second page,
wherein the first page comprises a first data area and a first meta area, and the second page comprises a second data area and a second meta area.

8. The method of claim 7, wherein the states comprise a pair of data bits stored in the first and second pages, respectively, in response to a voltage applied to the memory cell, the pair of data bits being sequentially changed in the order of 11, 01, 00 and 10 depending on a size of the applied voltage.

9. The method of claim 7, wherein (a) comprises:
storing bits of "0" in the first data area; and
storing bits of "1" in the first meta area.

10. The method of claim 9, wherein (b) comprises:
storing the data bits written by the user in the second data area; and
storing bits of "0" in the second meta area.

11. The method of claim 10, further comprising (c) determining validity of the data bits stored in the second page.

12. The method of claim 11, wherein (c) comprises:
extracting the data bits of the first and second meta areas; and
determining that the data bits of the second data area are valid if the extracted data bits are the bits of "1" and "0", respectively.

* * * * *